(12) United States Patent
Song et al.

(10) Patent No.: US 11,862,898 B2
(45) Date of Patent: *Jan. 2, 2024

(54) SHIELDING SHELL

(71) Applicant: DONGGUAN LUXSHARE TECHNOLOGIES CO., LTD, Dongguan (CN)

(72) Inventors: Tao Song, Dongguan (CN); Kun Liu, Dongguan (CN); Rongzhe Guo, Dongguan (CN); Chuanqi Gong, Dongguan (CN); Xiaogang Liu, Dongguan (CN); Ming Li, Dongguan (CN)

(73) Assignee: DONGGUAN LUXSHARE TECHNOLOGIES CO., LTD, Dongguan (CN)

( * ) Notice: Subject to any disclaimer, the term of this patent is extended or adjusted under 35 U.S.C. 154(b) by 371 days.

This patent is subject to a terminal disclaimer.

(21) Appl. No.: 17/334,457

(22) Filed: May 28, 2021

(65) Prior Publication Data

US 2021/0399496 A1 Dec. 23, 2021

(30) Foreign Application Priority Data

Jun. 19, 2020 (CN) .......................... 202010567796.4
Aug. 4, 2020 (CN) .......................... 202021598514.9

(51) Int. Cl.
*H01R 13/6471* (2011.01)
*H01R 13/6587* (2011.01)
(Continued)

(52) U.S. Cl.
CPC ....... *H01R 13/6471* (2013.01); *H01R 12/585* (2013.01); *H01R 12/716* (2013.01);
(Continued)

(58) Field of Classification Search
CPC .. H01R 12/585; H01R 12/716; H01R 12/724; H01R 12/722; H01R 12/712;
(Continued)

(56) References Cited

U.S. PATENT DOCUMENTS 4,601,527 A 7/1986 Lemke
5,664,968 A 9/1997 Mickievicz
(Continued)

FOREIGN PATENT DOCUMENTS

CN 1244959 A 2/2000
CN 2513252 Y 9/2002
(Continued)

*Primary Examiner* — Khiem M Nguyen
(74) *Attorney, Agent, or Firm* — Birch, Stewart, Kolasch & Birch, LLP

(57) ABSTRACT

A shielding shell used to at least partially surround signal terminals includes a first side wall, a second side wall and a third side wall. The second side wall connects the first side wall and the third side wall. The first side wall and the third side wall are disposed face to face. An end of at least one of the first side wall, the second side wall and the third side wall includes a deflection portion bent inwardly. The deflection portion is used to guide insertion of the shielding shell into a mating connector. As a result, a better shielding effect on the signal terminals can be provided. Besides, it is easy to guide insertion of the shielding shell into the mating connector.

19 Claims, 17 Drawing Sheets

(51) Int. Cl.

| | |
|---|---|
| *H01R 13/6585* | (2011.01) |
| *H01R 13/40* | (2006.01) |
| *H01R 13/6591* | (2011.01) |
| *H01R 13/514* | (2006.01) |
| *H01R 13/518* | (2006.01) |
| *H01R 12/72* | (2011.01) |
| *H01R 13/6586* | (2011.01) |
| *H01R 12/58* | (2011.01) |
| *H05K 1/11* | (2006.01) |
| *H01R 13/6588* | (2011.01) |
| *H01R 13/6583* | (2011.01) |
| *H01R 13/6582* | (2011.01) |
| *H01R 43/24* | (2006.01) |
| *H01R 12/71* | (2011.01) |
| *H01R 13/20* | (2006.01) |
| *H01R 13/504* | (2006.01) |
| *H01R 13/6461* | (2011.01) |
| *H01R 13/6584* | (2011.01) |
| *H05K 3/30* | (2006.01) |
| *H01R 13/02* | (2006.01) |
| *H05K 3/34* | (2006.01) |
| *H01R 13/6474* | (2011.01) |
| *H01R 13/502* | (2006.01) |
| *H01R 13/46* | (2006.01) |
| *H01R 13/646* | (2011.01) |
| *H01R 13/6473* | (2011.01) |
| *H01R 13/6581* | (2011.01) |

(52) U.S. Cl.
CPC .......... *H01R 12/724* (2013.01); *H01R 13/02* (2013.01); *H01R 13/20* (2013.01); *H01R 13/40* (2013.01); *H01R 13/504* (2013.01); *H01R 13/514* (2013.01); *H01R 13/518* (2013.01); *H01R 13/6461* (2013.01); *H01R 13/6582* (2013.01); *H01R 13/6583* (2013.01); *H01R 13/6584* (2013.01); *H01R 13/6585* (2013.01); *H01R 13/6586* (2013.01); *H01R 13/6587* (2013.01); *H01R 13/6588* (2013.01); *H01R 13/6591* (2013.01); *H01R 43/24* (2013.01); *H05K 1/115* (2013.01); *H05K 3/306* (2013.01); *H05K 3/3447* (2013.01); *H01R 12/71* (2013.01); *H01R 12/712* (2013.01); *H01R 12/722* (2013.01); *H01R 13/46* (2013.01); *H01R 13/502* (2013.01); *H01R 13/646* (2013.01); *H01R 13/6473* (2013.01); *H01R 13/6474* (2013.01); *H01R 13/6581* (2013.01); *H05K 2201/09236* (2013.01); *H05K 2201/1078* (2013.01); *H05K 2201/10189* (2013.01); *H05K 2201/10371* (2013.01); *H05K 2201/10871* (2013.01)

(58) Field of Classification Search
CPC .......... H01R 12/71; H01R 13/6471; H01R 13/6474; H01R 13/6591; H01R 13/6588; H01R 13/6587; H01R 13/6586; H01R 13/6585; H01R 13/6584; H01R 13/6583; H01R 13/6582; H01R 13/6581; H01R 13/6461; H01R 13/646; H01R 13/518; H01R 13/514; H01R 13/504; H01R 13/502; H01R 13/46; H01R 13/40; H01R 13/20; H01R 13/02; H01R 43/24; H05K 1/115; H05K 3/306; H05K 3/3447; H05K 2201/09236; H05K 2201/10189; H05K 2201/10371; H05K 2201/1078; H05K 2201/10871

USPC .................................................. 439/607.13
See application file for complete search history.

(56) References Cited

U.S. PATENT DOCUMENTS

| | | | |
|---|---|---|---|
| 6,435,914 B1 | 8/2002 | Billman | |
| 9,350,126 B2 | 5/2016 | Little et al. | |
| 9,548,570 B2 | 1/2017 | Laurx et al. | |
| 11,710,929 B2* | 7/2023 | Liu .................... | H01R 13/6471 439/607.08 |
| 11,710,930 B2* | 7/2023 | Liu .................... | H01R 13/6471 439/108 |
| 11,710,931 B2* | 7/2023 | Liu .................... | H01R 13/6471 439/607.05 |
| 2004/0043658 A1 | 3/2004 | Ko | |
| 2004/0229510 A1 | 11/2004 | Lloyd et al. | |
| 2007/0155239 A1 | 7/2007 | Nakada | |
| 2008/0014798 A1 | 1/2008 | Pan | |
| 2013/0203273 A1 | 8/2013 | Rathburn | |
| 2014/0051295 A1 | 2/2014 | Westman et al. | |
| 2014/0248796 A1 | 9/2014 | Pan | |
| 2014/0295705 A1 | 10/2014 | Lee et al. | |
| 2015/0194771 A1 | 7/2015 | Pan | |
| 2015/0044118 A1 | 8/2015 | Lin et al. | |
| 2015/0303618 A1 | 10/2015 | Lee et al. | |
| 2015/0318642 A1 | 11/2015 | Lee et al. | |
| 2016/0028189 A1 | 1/2016 | Resendez et al. | |
| 2016/0093985 A1 | 3/2016 | Zhang et al. | |
| 2016/0322760 A1 | 11/2016 | Long et al. | |
| 2018/0166828 A1 | 6/2018 | Gailus | |
| 2019/0044284 A1 | 2/2019 | Dunham | |

FOREIGN PATENT DOCUMENTS

| | | | |
|---|---|---|---|
| CN | 2571029 | Y | 9/2003 |
| CN | 1491465 | A | 4/2004 |
| CN | 1592990 | A | 3/2005 |
| CN | 2682605 | Y | 3/2005 |
| CN | 101159354 | A | 4/2008 |
| CN | 201142392 | Y | 10/2008 |
| CN | 101330172 | A | 12/2008 |
| CN | 101527409 | A | 9/2009 |
| CN | 101542640 | A | 9/2009 |
| CN | 101728667 | A | 6/2010 |
| CN | 101752700 | A | 6/2010 |
| CN | 101853996 | A | 10/2010 |
| CN | 101459299 | B | 11/2010 |
| CN | 102088148 | A | 6/2011 |
| CN | 102290653 | A | 12/2011 |
| CN | 102468562 | A | 5/2012 |
| CN | 202395246 | U | 8/2012 |
| CN | 102694308 | A | 9/2012 |
| CN | 102969621 | A | 3/2013 |
| CN | 103151650 | A | 6/2013 |
| CN | 103247918 | A | 8/2013 |
| CN | 103296546 | A | 9/2013 |
| CN | 103311746 | A | 9/2013 |
| CN | 203288874 | U | 11/2013 |
| CN | 10579835 | A | 2/2014 |
| CN | 203589266 | U | 5/2014 |
| CN | 103928795 | A | 7/2014 |
| CN | 103988371 | A | 8/2014 |
| CN | 203800269 | U | 8/2014 |
| CN | 104037551 | A | 9/2014 |
| CN | 104241975 | A | 12/2014 |
| CN | 104396095 | A | 3/2015 |
| CN | 104505678 | A | 4/2015 |
| CN | 104577406 | A | 4/2015 |
| CN | 204304028 | U | 4/2015 |
| CN | 104779487 | A | 7/2015 |
| CN | 104810657 | A | 7/2015 |
| CN | 105024230 | A | 11/2015 |
| CN | 105470679 | A | 4/2016 |
| CN | 105470732 | A | 4/2016 |
| CN | 105470736 | A | 4/2016 |
| CN | 105612664 | A | 5/2016 |

(56) References Cited

FOREIGN PATENT DOCUMENTS

| | | |
|---|---|---|
| CN | 105703159 A | 6/2016 |
| CN | 105742854 A | 7/2016 |
| CN | 105958245 A | 9/2016 |
| CN | 106207569 A | 12/2016 |
| CN | 205846279 U | 12/2016 |
| CN | 107104329 A | 8/2017 |
| CN | 104009303 B | 1/2018 |
| CN | 107565279 A | 1/2018 |
| CN | 207530119 U | 6/2018 |
| CN | 109390806 A | 2/2019 |
| CN | 109546384 A | 3/2019 |
| CN | 109546388 A | 3/2019 |
| CN | 109586086 A | 4/2019 |
| CN | 109599724 A | 4/2019 |
| CN | 109659726 A | 4/2019 |
| CN | 109841981 A | 6/2019 |
| CN | 109950721 A | 6/2019 |
| CN | 208955335 U | 6/2019 |
| CN | 109994892 A | 7/2019 |
| CN | 209056665 U | 7/2019 |
| CN | 110165448 A | 8/2019 |
| CN | 110247233 A | 9/2019 |
| CN | 110299649 A | 10/2019 |
| CN | 110323622 A | 10/2019 |
| CN | 110459919 A | 11/2019 |
| CN | 110544850 A | 12/2019 |
| CN | 110600943 A | 12/2019 |
| CN | 110649407 A | 1/2020 |
| CN | 110718815 A | 1/2020 |
| CN | 110808499 A | 2/2020 |
| CN | 110838635 A | 2/2020 |
| CN | 111092342 A | 5/2020 |
| CN | 111370890 A | 7/2020 |
| CN | 111682366 A | 9/2020 |
| CN | 111682369 A | 9/2020 |
| JP | 2000-058172 A | 2/2000 |
| TW | 415133 B | 12/2000 |
| TW | 459428 B | 10/2001 |
| TW | M461166 U1 | 9/2013 |
| TW | I414111 B | 11/2013 |
| TW | I452767 B | 9/2014 |
| TW | I528659 B | 4/2016 |
| TW | I545845 B | 8/2016 |
| TW | M537321 U | 2/2017 |
| TW | 201733225 A | 9/2017 |
| TW | I600231 B | 9/2017 |
| TW | 201810825 A | 3/2018 |
| TW | I623154 B | 5/2018 |
| TW | 201834333 A | 9/2018 |
| TW | 201841440 A | 11/2018 |
| TW | I648925 B | 1/2019 |
| TW | M585436 U | 10/2019 |
| TW | 201943158 A | 11/2019 |
| TW | M591270 U | 2/2020 |
| TW | M593091 U | 4/2020 |
| TW | 202048584 A | 12/2020 |
| WO | WO 2016/168820 A1 | 10/2016 |
| WO | WO 2017/106266 A1 | 6/2017 |

\* cited by examiner

SHIELDING SHELL

CROSS-REFERENCE TO RELATED APPLICATIONS

This patent application claims priority of a Chinese Patent Application No. 202010567796.4, filed on Jun. 19, 2020 and titled "BACKPLANE CONNECTOR ASSEMBLY", and a Chinese Patent Application No. 202021598514.9, filed on Aug. 4, 2020 and titled "SHIELDING SHELL", the entire content of which is incorporated herein by reference.

TECHNICAL FIELD

The present disclosure relates to a shielding shell, which belongs to the technical field of backplane connectors.

BACKGROUND

The existing backplane connector assembly usually includes a male connector and a female connector which are mateable with each other. The male connector and the female connector respectively include mutually mateable conductive terminals. In general, the conductive terminals include signal terminals and ground terminals so as to improve the quality of signal transmission.

However, as the requirements for the quality of signal transmission continue to increase, it is necessary to design a shielding shell with a better data transmission protection effect for the signal terminals. When the male connector and the female connector are mated with each other, the shielding shell can also provide a guiding function for inserting the male connector into the female connector.

SUMMARY

An object of the present disclosure is to provide a shielding shell capable of shielding signal terminals and having a guiding function.

In order to achieve the above object, the present disclosure adopts the following technical solution: a shielding shell for at least partially surrounding signal terminals, the shielding shell comprising: a first side wall; a second side wall; and a third side wall, the second side wall connecting the first side wall and the third side wall, and the first side wall and the third side wall are disposed face to face; wherein an end of at least one of the first side wall, the second side wall and the third side wall comprises a deflection portion which is bent inwardly, and the deflection portion is adapted to guide insertion of the shielding shell into a mating connector.

Compared with the prior art, the shielding shell of the present disclosure is used to at least partially surround the signal terminals, thereby providing a better shielding effect on the signal terminals. In addition, by setting the end of at least one of the first side wall, the second side wall and the third side wall with the deflection portion which is bent inwardly, it is easy to guide insertion of the shielding shell into the mating connector.

DETAILED DESCRIPTION

Figure 1:
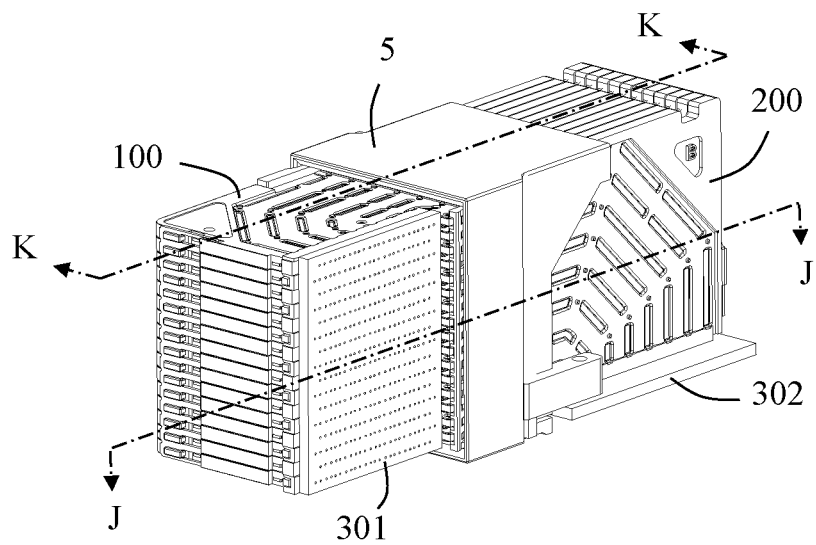
FIG. 1 is a perspective view of a backplane connector assembly in accordance with an embodiment of the disclosure.

Exemplary embodiments will be described in detail here, examples of which are shown in drawings. When referring to the drawings below, unless otherwise indicated, same numerals in different drawings represent the same or similar elements. The examples described in the following exemplary embodiments do not represent all embodiments consistent with this application. Rather, they are merely examples of devices and methods consistent with some aspects of the application as detailed in the appended claims.

The terminology used in this application is only for the purpose of describing particular embodiments, and is not intended to limit this application. The singular forms "a", "said", and "the" used in this application and the appended claims are also intended to include plural forms unless the context clearly indicates other meanings.

It should be understood that the terms "first", "second" and similar words used in the specification and claims of this application do not represent any order, quantity or importance, but are only used to distinguish different components. Similarly, "an" or "a" and other similar words do not mean a quantity limit, but mean that there is at least one; "multiple" or "a plurality of" means two or more than two. Unless otherwise noted, "front", "rear", "lower" and/or "upper" and similar words are for ease of description only and are not limited to one location or one spatial orientation. Similar words such as "include" or "comprise" mean that elements or objects appear before "include" or "comprise" cover elements or objects listed after "include" or "comprise" and their equivalents, and do not exclude other elements or objects. The term "a plurality of" mentioned in the present disclosure includes two or more.

Hereinafter, some embodiments of the present disclosure will be described in detail with reference to the accompanying drawings. In the case of no conflict, the following embodiments and features in the embodiments can be combined with each other.

First Embodiment

Figure 2:
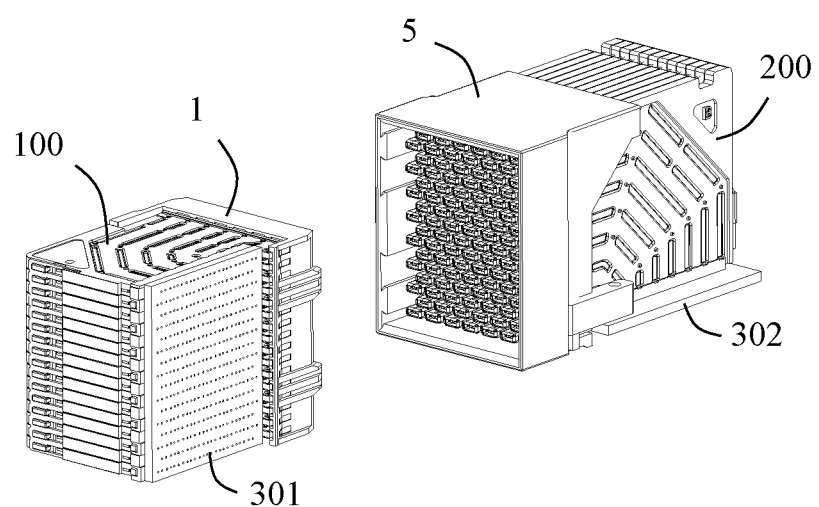
FIG. 2 is a partial perspective exploded view of FIG. 1.

Referring to FIGS. 1 and 2, a first embodiment of the present disclosure discloses a backplane connector assembly which includes a first backplane connector 100, a second backplane connector 200 for mating with the first backplane connector 100, a first circuit board 301 mounted with the first backplane connector 100, and a second circuit board 302 mounted with the second backplane connector 200. In the illustrated embodiment of the present disclosure, the first backplane connector 100 and the second backplane connector 200 are mated in an orthogonal manner. The first circuit board 301 is perpendicular to the second circuit board 302.

Figure 3:
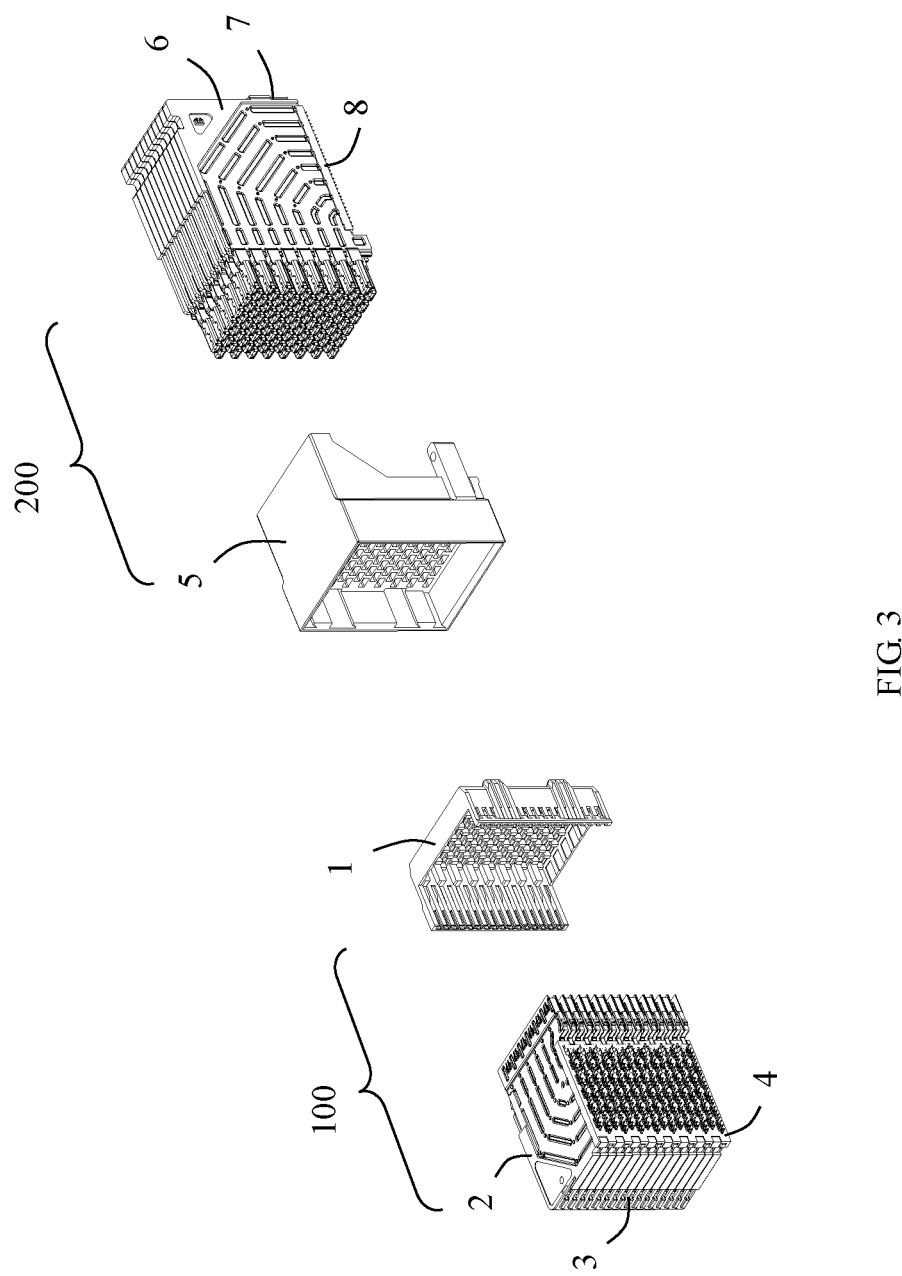
FIG. 3 is a further perspective exploded view of FIG. 2.
Figure 4:
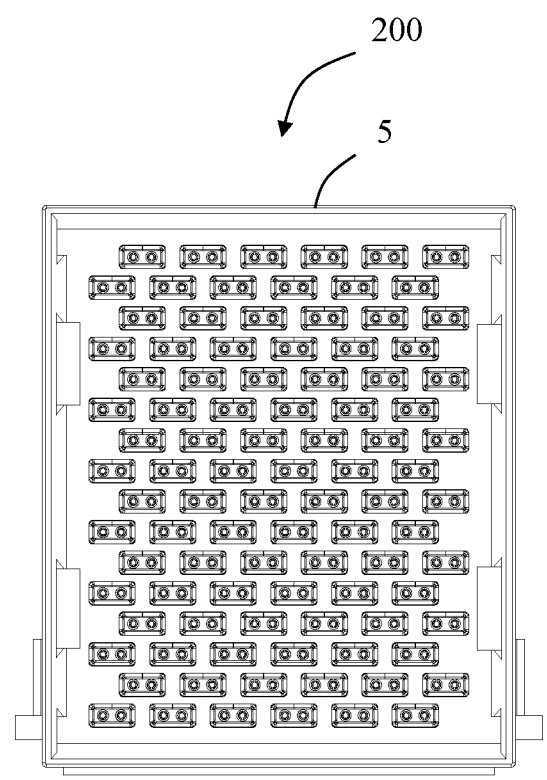
FIG. 4 is a front view of a second backplane connector in accordance with an embodiment of the present disclosure.

Referring to FIGS. 3 and 4, the first backplane connector 100 includes a first header 1, a plurality of first wafers 2 assembled to the first header 1, a first spacer 3 fixed at a rear end of the plurality of first wafers 2, and a first mounting block 4 mounted at a bottom end of the plurality of first wafers 2.

The second backplane connector 200 includes a second header 5, a plurality of second wafers 6 assembled to the second header 5, a second spacer 7 holding on one side of the plurality of second wafers 6, and a second mounting block 8 holding the other side of the plurality of second wafers 6.

Figure 5:
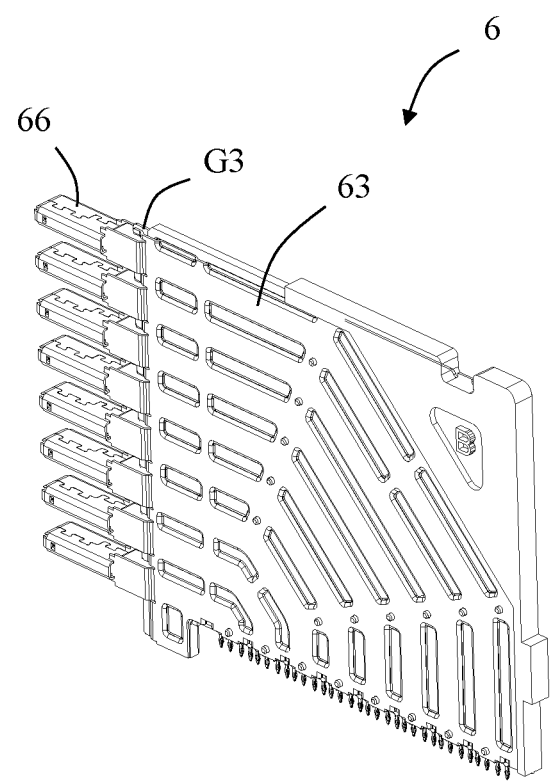
FIG. 5 is a perspective schematic view of a wafer of the second backplane connector.
Figure 6:
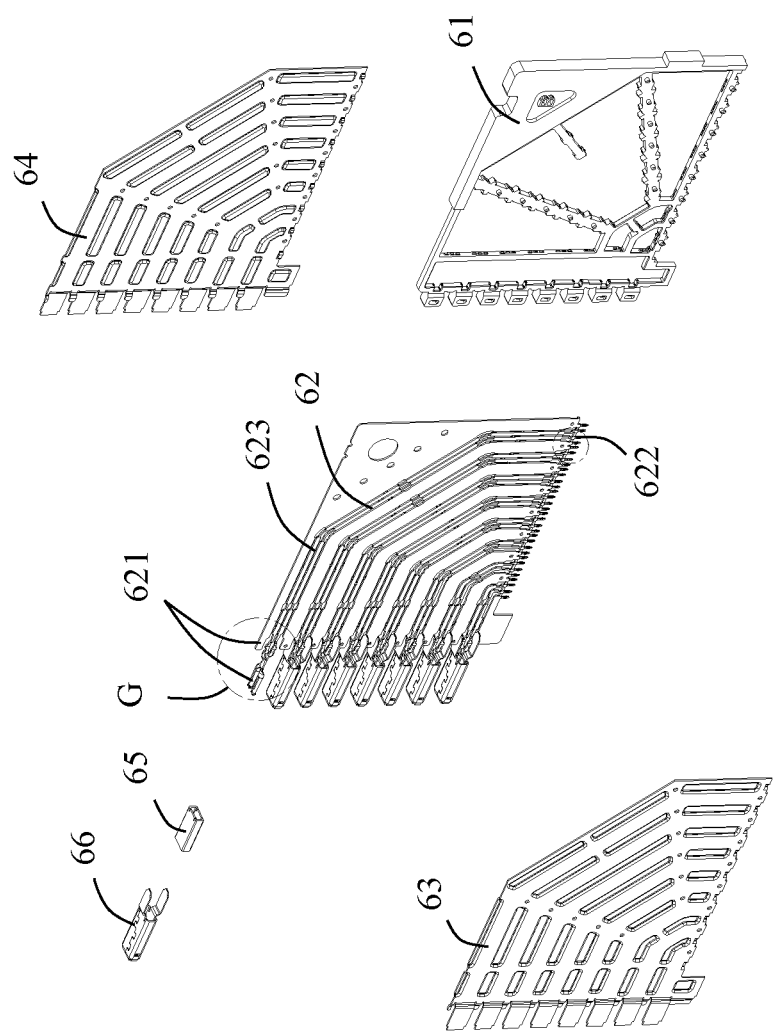
FIG. 6 is a partially exploded perspective view of FIG. 5.

Referring to FIGS. 5 and 6, each second wafer 6 includes a second insulating frame 61, a plurality of second conductive terminals 62 insert-molded with the second insulating frame 61, a third metal shield 63 fixed on one side of the second insulating frame 61, and a fourth metal shield 64 fixed on the other side of the second insulating frame 61.

Each second conductive terminals 62 includes a second contact portion 621, second tail portion 622, and a second connection portion 623 connecting the second contact portion 621 and the second tail portion 622. Some of the second contact portions 621 are used to electrically connect with the first backplane connector 100. The second tail portions 622 are used to be mounted to the second circuit board 302. In the illustrated embodiment of the present disclosure, the second contact portion 621 is substantially perpendicular to the second tail portion 622. The second connection portion 623 is of a curved configuration.

Figure 7:
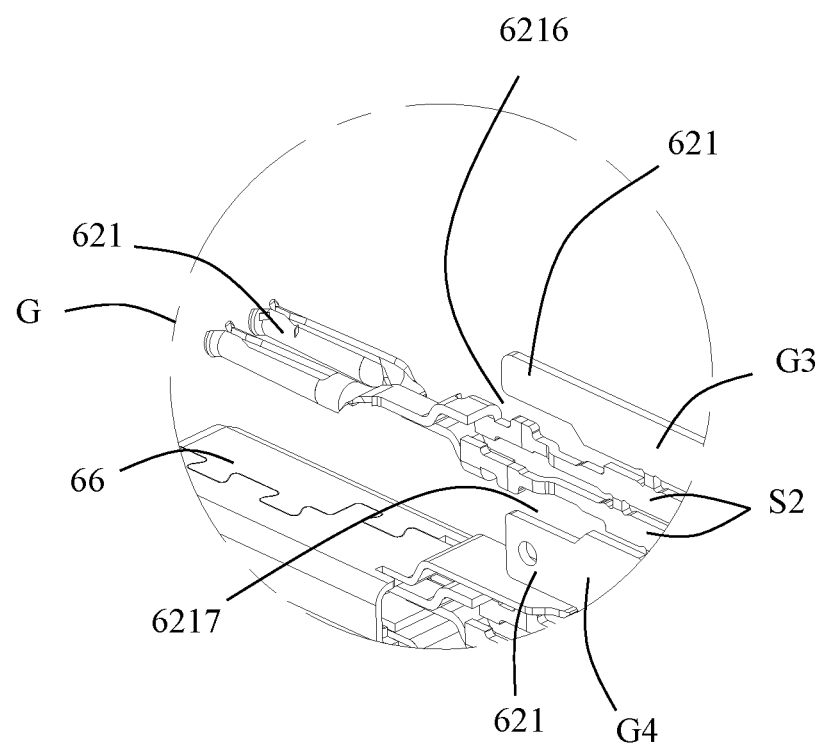
FIG. 7 is a partial enlarged view of a circled part G in FIG. 6.

Referring to FIG. 7, each group of second conductive terminals 62 include a plurality of third ground terminals G3, a plurality of fourth ground terminals G4, and a plurality of second signal terminals S2. In the illustrated embodiment of the present disclosure, two adjacent second signal terminals S2 form a pair of second differential signal terminals. Each pair of second differential signal terminals are located between one third ground terminal G3 and one fourth ground terminal G4. That is, each group of second conductive terminals 62 are disposed in a manner of G3-S2-S2-G4, which is beneficial to improve the quality of signal transmission. The second differential signal terminals are narrow-side coupling or wide-side coupling. A width of the third ground terminal G3 and a width of the fourth ground terminal G4 are greater than a width of each second signal terminal S2 therebetween, which is beneficial to increase the shielding area and improve the shielding effect.

Figure 8:
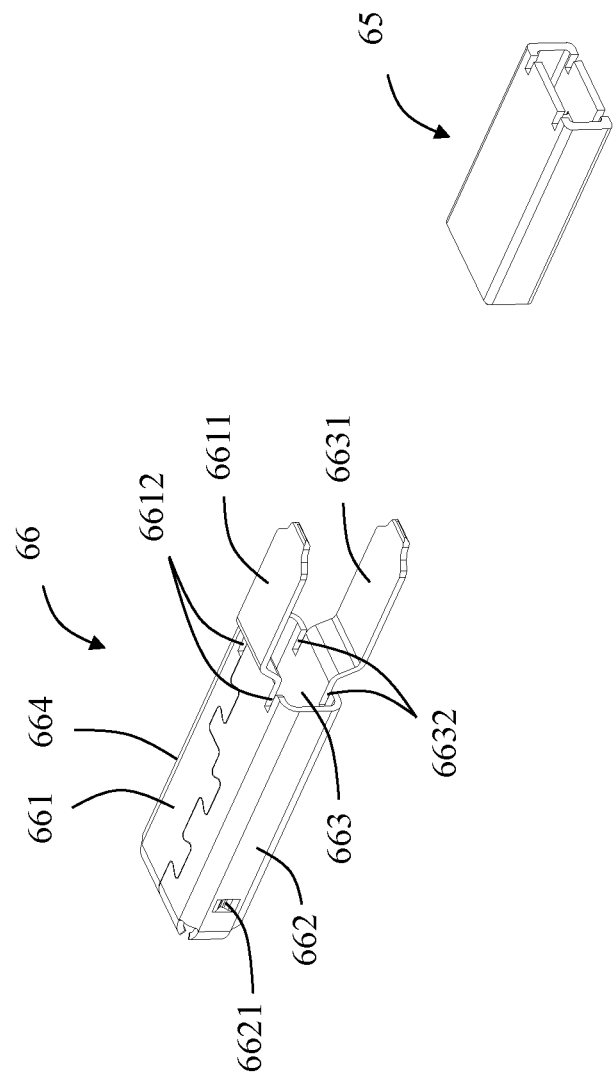
FIG. 8 is a perspective exploded view of an insulating block and a shielding shell.
Figure 9:
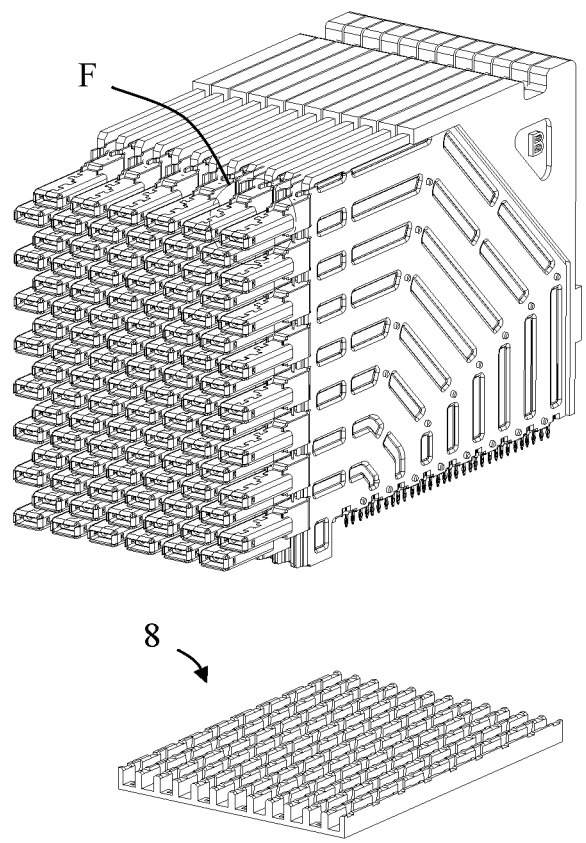
FIG. 9 is a partial perspective exploded view of the second backplane connector, in which a second mounting block is separated.
Figure 10:
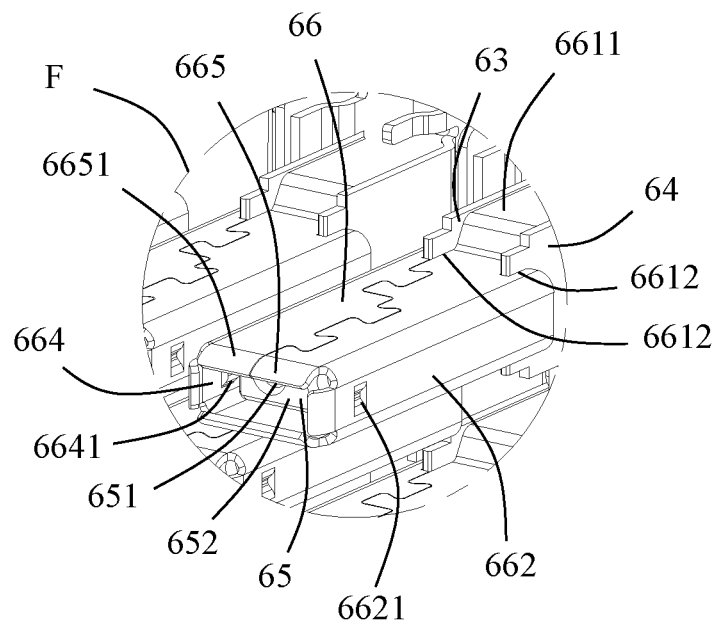
FIG. 10 is a partial enlarged view of a circled part F in FIG. 9.
Figure 11:
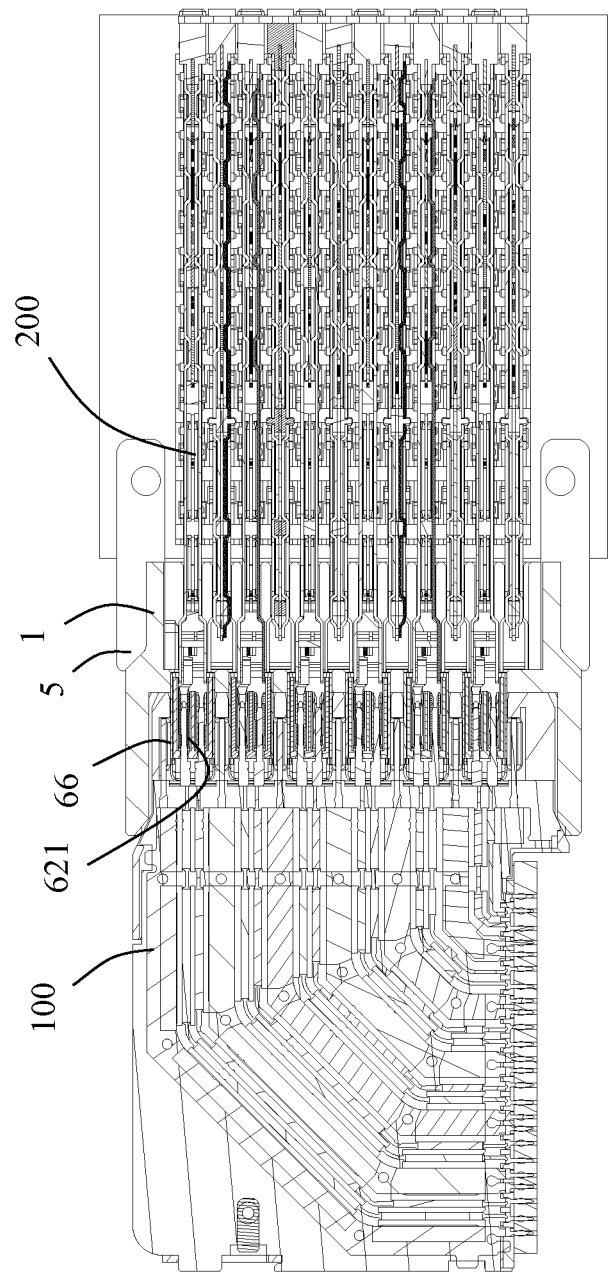
FIG. 11 is a schematic cross-sectional view taken along line J-J in FIG. 1.
Figure 12:
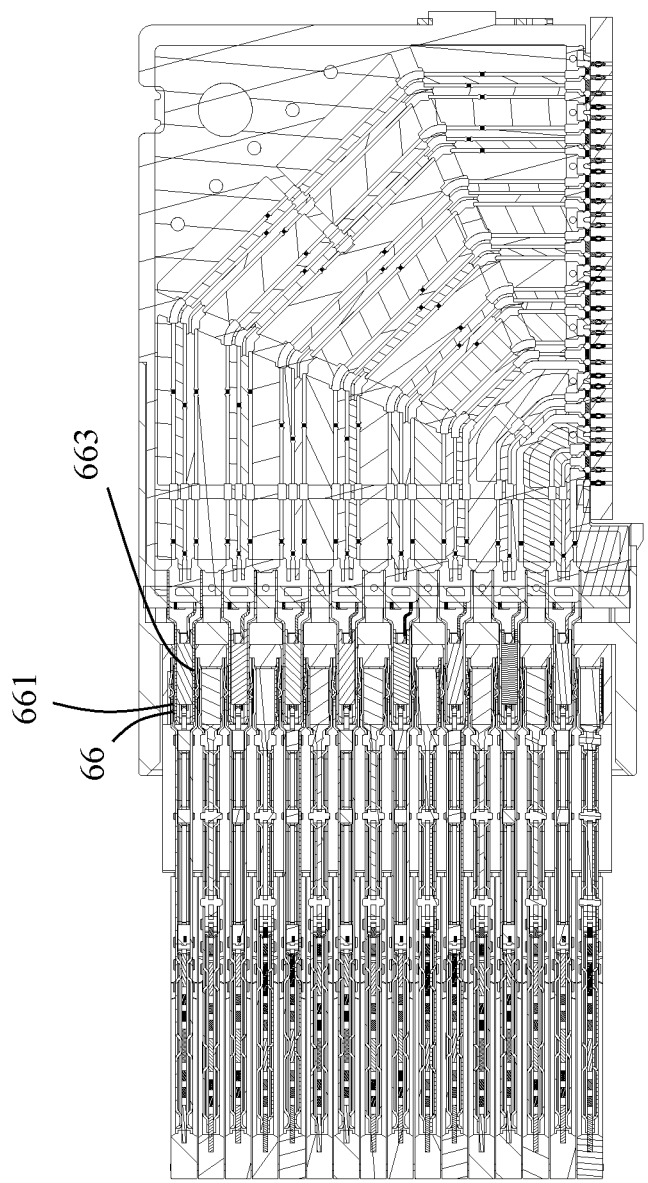
FIG. 12 is a schematic cross-sectional view taken along line K-K in FIG. 1.

Referring to FIGS. 8 to 10, each group of second wafers 6 further includes an insulating block 65 sleeved on the second contact portions 621, and a shielding shell 66 sleeved on the insulating block 65. Each insulating block 65 includes two through holes 651 into which the second contact portions 621 of the second signal terminals S2 are inserted, and a mating surface 652 at an end thereof. In the illustrated embodiment of the present disclosure, the insulating block 65 is substantially cuboid shaped. Correspondingly, the shielding shell 66 is substantially cuboid shaped.

The shielding shell 66 includes a first side wall 661, a second side wall 662, a third side wall 663 and a fourth side wall 664. The first side wall 661 is opposite to the third side wall 663. The second side wall 662 is opposite to the fourth side wall 664. An area of the first side wall 661 and the third side wall 663 is larger than an area of the second side wall 662 and the fourth side wall 664. The ends of the first side wall 661, the second side wall 662, the third side wall 663 and the fourth side wall 664 all include a deflection portion 665 which is bent inwardly. By providing the deflection portions 665, a constricted portion can be formed at an end of the shielding shell 66, so that outer surfaces 6651 of the deflection portions 665 can guide the second wafer 6 to be assembled to the second header 5, and even guide the shielding shell 66 to be inserted into the shielding space 27 of the first backplane connector 100. In addition, in order to better restrict the insulating block 65, the second side wall 662 and the fourth side wall 664 further include restriction protrusions 6621, 6641 formed by stamping the second side wall 662 and the fourth side wall 664 inwardly. The restriction protrusions 6621, 6641 are used to mate with the insulating block 65 so as to prevent the insulating block 65 from being drawn out of the shielding shell 66. Of course, in other embodiments, the restriction protrusions 6621, 6641 can be provided on the first side wall 661 and the third side wall 663 so as to prevent the insulating block 65 from being drawn out of the shielding shell 66.

In the illustrated embodiment of the present disclosure, the shielding shell 66 further includes a first extension piece 6611 extending from the first side wall 661 and a pair of first slots 6612 located on opposite sides of the first extension piece 6611. The shielding shell 66 further includes a second extension piece 6631 extending from the third side wall 663 and a pair of second slots 6632 located on opposite sides of the second extension piece 6631. The first extension piece 6611 is in vertical contact with the second contact portion 621 of the third ground terminal G3 so as to improve the shielding effect. The second extension piece 6631 is in vertical contact with the second contact portion 621 of the fourth ground terminal G4 so as to improve the shielding effect. In the illustrated embodiment of the present disclosure, the first extension piece 6611 and the second extension piece 6631 are deflected outwardly and then extend, so that a distance between the first extension piece 6611 and the second extension piece 6631 on the same shielding shell 66 is greater than a distance between the first side wall 661 and the third side wall 663. Referring to FIG. 7, for a group of second conductive terminals 62 arranged in the manner of G3-S2-S2-G4, the second contact portion 621 of the third ground terminal G3 includes a first notch 6216 adjacent to the second differential signal terminals. The first notch 6216 is used for receiving the first extension piece 6611. The second contact portion 621 of the fourth ground terminal G4 includes a second notch 6217 adjacent to the second differential signal terminals. The second notch 6217 is used for receiving the second extension piece 6631. In the illustrated embodiment of the present disclosure, taking two adjacent pairs of second differential signal terminals sharing one fourth ground terminal G4 as an example, two sides of the fourth ground terminal G4 respectively include second notches 6217 facing different second differential signal terminals, and the second notches 6217 are used for mating with two adjacent shielding shells 66.

When the first backplane connector 100 is mated with the second backplane connector 200, the first header 1 of the first backplane connector 100 is at least partially inserted into the second header 5 of the second backplane connector 200. The shielding shells 66 of the second wafers 6 of the second backplane connector 200 are inserted into the first backplane connector 100 under the guidance of the deflection portions 665.

Second Embodiment

Figure 13:
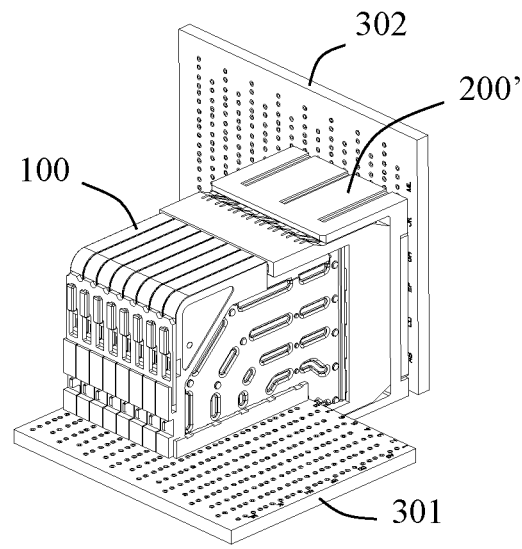
FIG. 13 is a perspective schematic view of a backplane connector assembly in another embodiment of the present disclosure.
Figure 14:
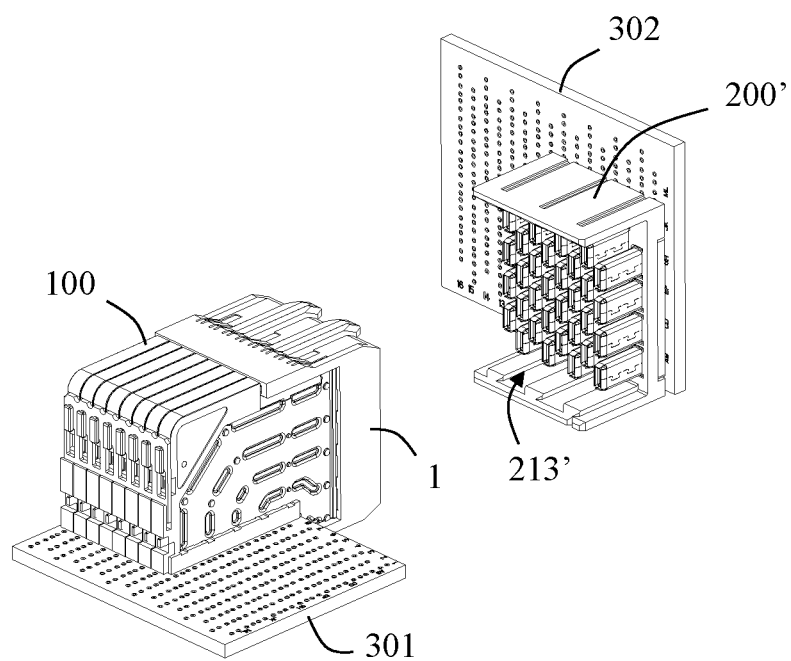
FIG. 14 is a partially exploded perspective view of FIG. 13.

Referring to FIGS. 13 and 14, the second embodiment of the present disclosure also discloses another backplane connector assembly which includes the first backplane connector 100 shown in FIGS. 1 to 12 and another second backplane connector 200' mated with the first backplane connector 100. The first backplane connector 100 is adapted for being mounted on the first circuit board 301. The second backplane connector 200' is adapted for being mounted on the second circuit board 302. Since the first backplane connector 100 has been described in detail in the first embodiment, it will not be described in detail in the second embodiment of the present disclosure, and its related structure will be directly quoted.

Figure 15:
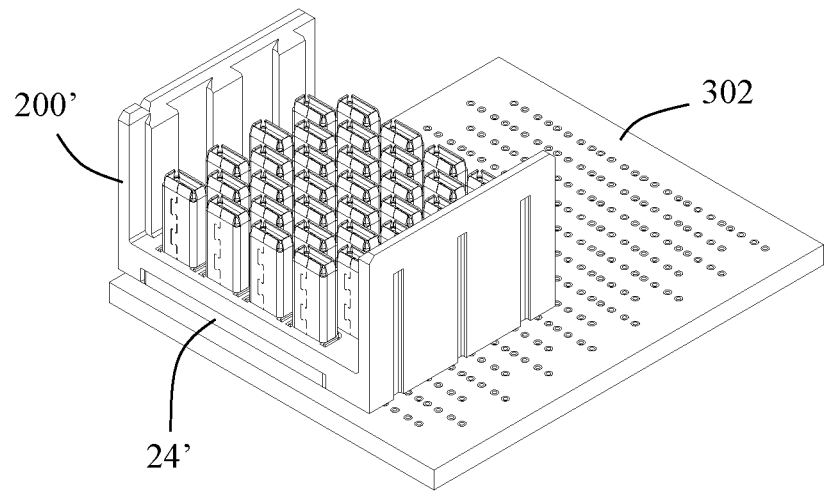
FIG. 15 is another view of a second backplane connector in FIG. 14 when the second backplane connector is mounted to a second circuit board.
Figure 16:
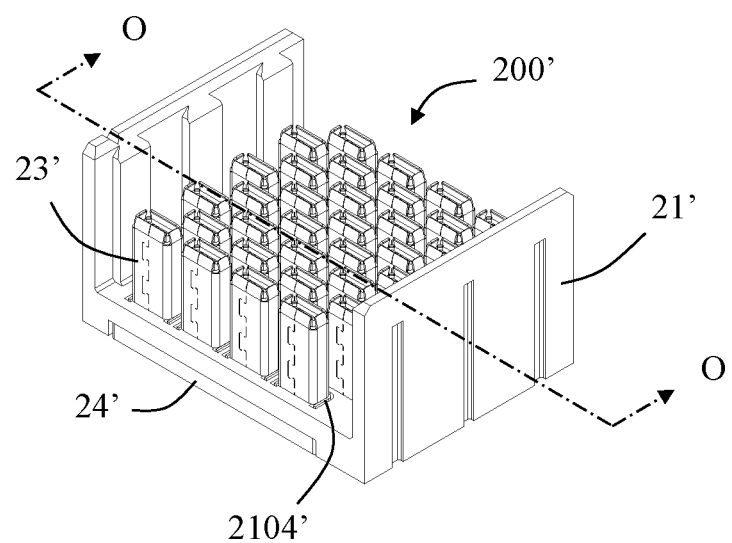
FIG. 16 is a perspective schematic view of the second backplane connector in FIG. 15.
Figure 17:
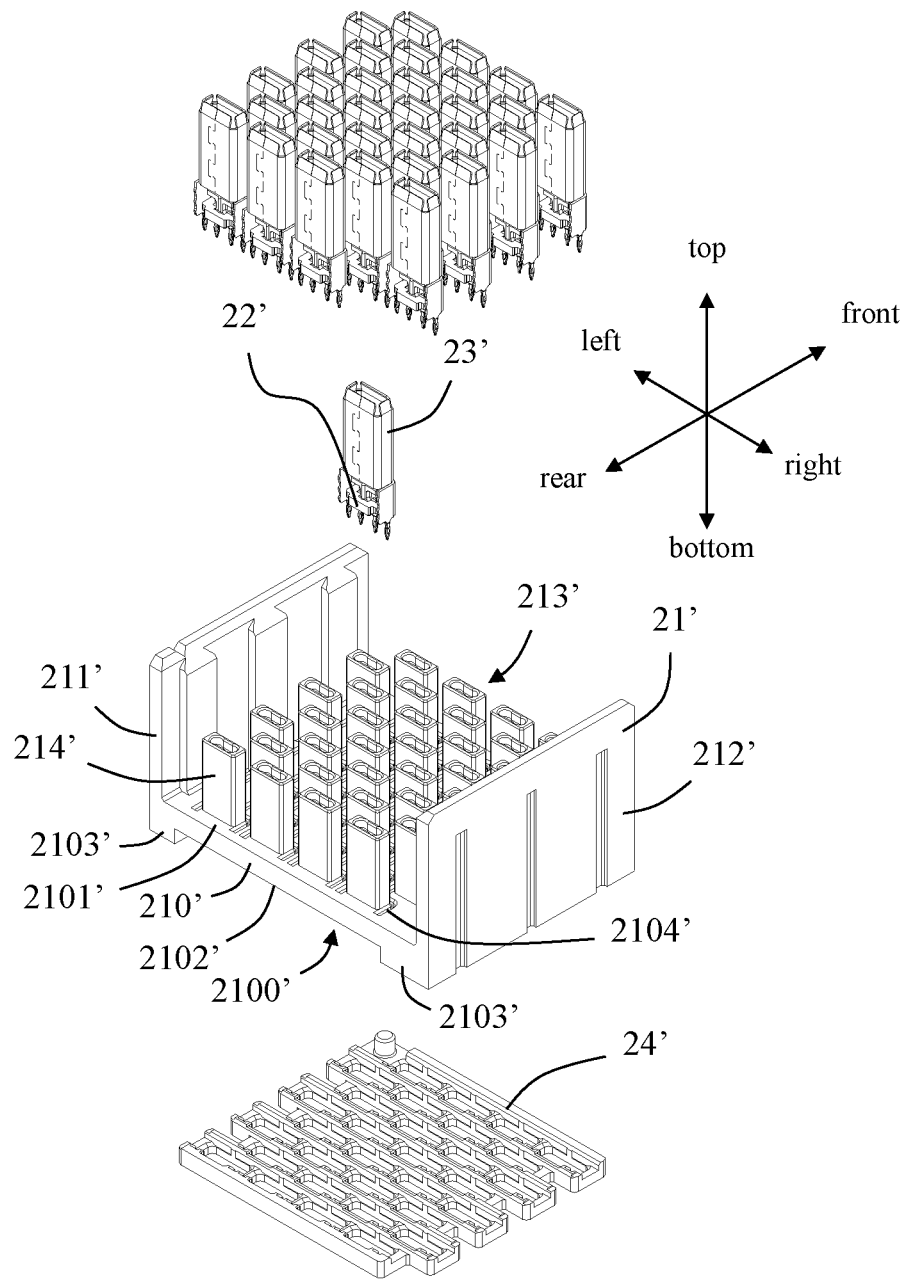
FIG. 17 is a partially exploded perspective view of the second backplane connector in FIG. 16.
Figure 18:
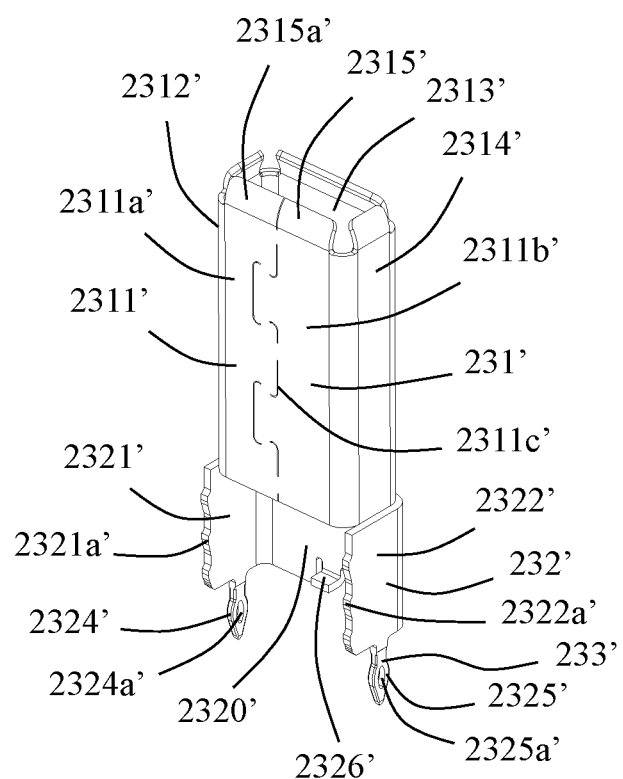
FIG. 18 is a perspective schematic view of the shielding shell.
Figure 19:
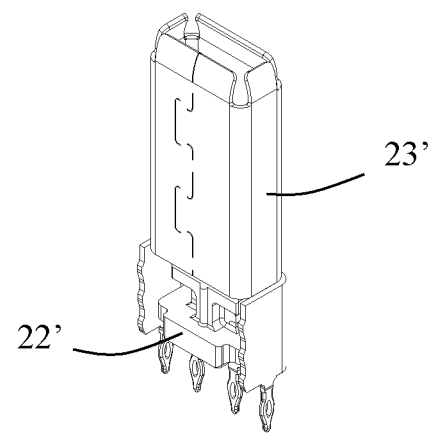
FIG. 19 is a perspective view of the shielding shell when it is sleeved on a second terminal module.
Figure 20:
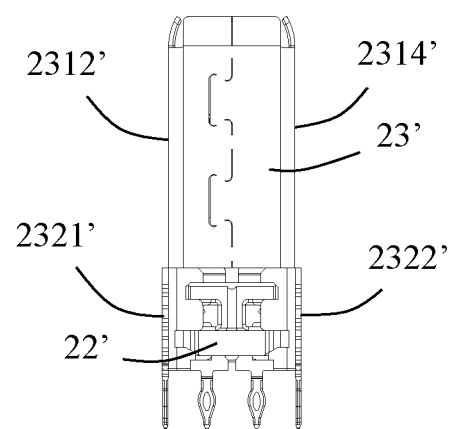
FIG. 20 is a front view of FIG. 19.
Figure 21:
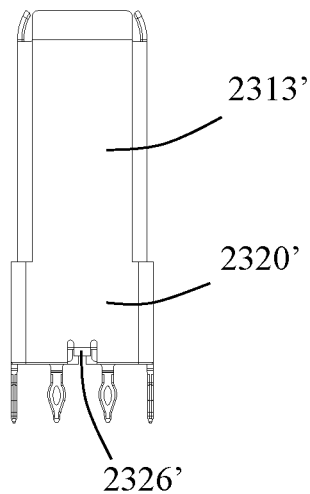
FIG. 21 is a rear view of FIG. 19.
Figure 22:
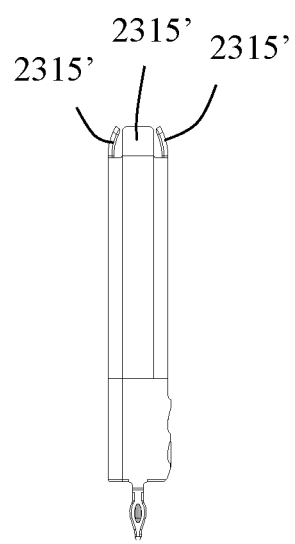
FIG. 22 is a left side view of FIG. 19.
Figure 23:
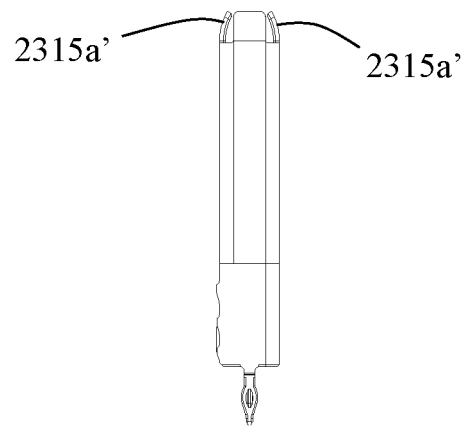
FIG. 23 is a right side view of FIG. 19.

Referring to FIGS. 15 to 17, the second backplane connector 200' includes a housing 21', a plurality of second terminal modules 22' installed in the housing 21', a plurality of shielding shells 23' fixed to the second housing 21' and located outside corresponding second terminal modules 22', and a second mounting block 24' mounted to the housing 21'.

Referring to FIG. 17, the housing 21' is made of insulating material and includes a base 210', a first side wall 211' extending upwardly from one side of the base 210', and a second side wall 212' extending upwardly from the other side of the base 210'. The base 210', the first side wall 211' and the second side wall 212' jointly form a receiving space 213' for receiving a part of the first backplane connector 100. In the illustrated embodiment of the present disclosure, the first side wall 211' and the second side wall 212' are parallel to each other and both are perpendicular to the base 210'.

In the illustrated embodiment of the present disclosure, the housing 21' further includes a plurality of insulating protrusions 214' integrally extending from the base 210'. The plurality of insulating protrusions 214' are spaced apart from one another. The plurality of insulating protrusions 214' extend upwardly into the receiving space 213'. The plurality of insulating protrusions 214' are disposed in multiple rows along a front-to-rear direction. The insulating protrusions 214' in two adjacent rows are disposed in a staggered manner, that is, the insulating protrusions 214' in the same position in two adjacent rows are not in alignment with each other in the front-to-rear direction. The base 210' includes a top surface 2101' exposed in the receiving space 213', a bottom surface 2102' opposite to the top surface 2101', two mounting protrusions 2103' respectively protruding downwardly from opposite sides of the bottom surface 2102', and a receiving groove 2100' located between the two mounting protrusions 2103'. The receiving groove 2100' is adapted for receiving the second mounting block 24'.

Referring to FIGS. 16 and 17, the base 210' includes a plurality of positioning grooves 2104' extending through the top surface 2101'. In the illustrated embodiment of the present disclosure, each positioning groove 2104' is substantially U-shaped. The positioning groove 2104' is arranged around the corresponding insulating protrusion 214' and is used to install the corresponding shielding shell 23'. In the illustrated embodiment of the present disclosure, each positioning groove 2104' also extends through the bottom surface 2102' so as to communicate with the receiving groove 2100'.

Referring to FIGS. 18 to 24. In the illustrated embodiment of the present disclosure, the shielding shell 23' is formed by stamping, bending and riveting a metal plate. The shielding shell 23' includes a hollow portion 231', a mounting portion 232' extending downwardly from the hollow portion 231', and a plurality of mounting feet 233' extending downwardly from the mounting portion 232'. The hollow portion 231' includes a first side wall 2311', a second side wall 2312', a third side wall 2313' and a fourth side wall 2314' which are connected in sequence. The first side wall 2311' is opposite to the third side wall 2313', and the second side wall 2312' is opposite to the fourth side wall 2314', thereby forming an enclosed shielding cavity. Of course, in other embodiments, the shielding cavity may also be of a non-enclosed type. For example, the hollow portion 231' includes a first side wall 2311', a second side wall 2312', and a third side wall 2313' which are connected in sequence, so that the hollow portion 231' is substantially U-shaped. In the illustrated embodiment of the present disclosure, areas of the first side wall 2311' and the third side wall 2313' are larger than areas of the second side wall 2312' and the fourth side wall 2314'. Each end of the first side wall 2311', the second side wall 2312', the third side wall 2313' and the fourth side wall 2314' includes a deflection portion 2315' which is bent inwardly. The deflection portions 2315' are independent from one another so that they can be bent independently in order to avoid mutual interference. Each deflection portion 2315' has a guiding portion 2315a' on its outer surface. By providing the deflection portions 2315', a constricted opening can be formed at the end of the shielding shell 23'. The guiding portion 2315a' can guide the deflection portions 2315' from being easily inserted into the first backplane connector 100. In the illustrated embodiment of the present disclosure, the first side wall 2311' includes a first wall portion 2311a' and a second wall portion 2311b'. The first wall portion 2311a' and the second wall portion 2311b' are fixed together by riveting. A riveting line 2311c' is formed at a junction of the first wall portion 2311a' and the second wall portion 2311b'. In other embodiments of the present disclosure, it is also possible that only the ends of at least three of the first side wall 2311', the second side wall 2312', the third side wall 2313' and the fourth side wall 2314' which are connected to each other, are provided with the deflection portions 2315' bent inwardly.

In the illustrated embodiment of the present disclosure, the mounting portion 232' is substantially U-shaped, and includes a base portion 2320', a first bending portion 2321' bent from one side of the base portion 2320', a second bending portion 2322' bent from the other side of the base portion 2320', a first tail portion 2324' extending downwardly from the first bending portion 2321', and a second tail portion 2325' extending downwardly from the second bending portion 2322'. The base portion 2320' is coplanar with the third side wall 2313'. The first bending portion 2321' and the second side wall 2312' are located on the same side. The first bending portion 2321' protrudes outwardly beyond the second side wall 2312'. The second bending portion 2322' and the fourth side wall 2314' are located on the same side. The second bending portion 2322' protrudes outwardly beyond the fourth side wall 2314'. The mounting portion 232' also includes a bottom retaining portion 2326' located at the base portion 2320'. In the illustrated embodiment of the present disclosure, when the shielding shell 23' is not mounted to the insulating protrusion 214', the retaining portion 2326' and the base portion 2320' are located in the same plane. After the shielding shell 23' is installed to the insulating protrusion 214', the retaining portion 2326' is bent inwardly (that is, in a direction toward the first side wall 2311') so that the retaining portion 2326' is perpendicular to the base portion 2320'. The retaining portion 2326' is located in the middle of the bottom edge of the base portion 2320'. A plurality of first barbs 2321a' are further provided on the side of the first bending portion 2321' away from the third side wall 2313'. A plurality of second barbs 2322a' are further provided on the side of the second bending portion 2322' away from the third side wall 2313'. The first barbs 2321a' and the second barbs 2322a' both extend beyond the first side wall 2311' to be fixed in the housing 21'. The first tail portion 2324' is provided with a first fisheye hole 2324a', so that the first tail portion 2324' has a certain degree of elasticity. Therefore, the first tail portion 2324' can be easily pressed into the conductive hole of the second circuit board 302 for achieving electrical conduction. The second tail portion 2325' is provided with a second fisheye hole 2325a', so that the second tail portion 2325' has a certain elasticity. Therefore, the second tail portion 2325' can be easily pressed into the conductive hole of the second circuit board 302 for achieving electrical conduction. In the illustrated embodiment of the present disclosure, the first tail portion 2324' and the second tail portion 2325' are arranged parallel to each other and are in alignment with each other along the left-to-right direction.

Figure 24:
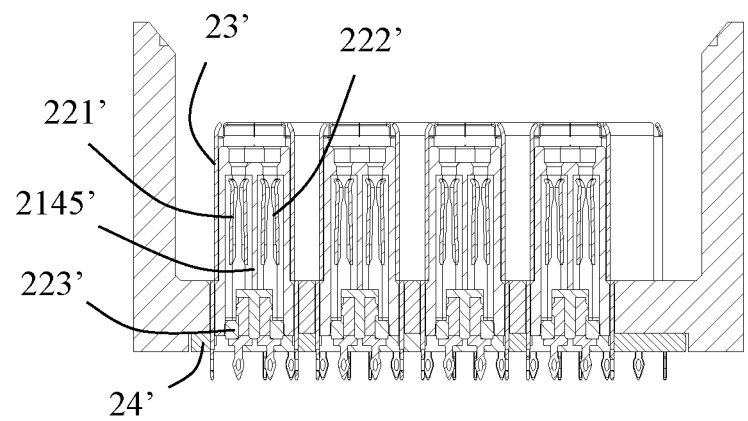
FIG. 24 is a schematic cross-sectional view taken along line O-O in FIG. 16.

Referring to FIG. 24, each second terminal module 22' includes a first signal terminal 221', a second signal terminal 222', and an insulating block 223' fixed to the first signal terminal 221' and the second signal terminal 222'. In an embodiment of the present disclosure, the first signal terminal 221' and the second signal terminal 222' are insert-molded with the insulating block 223'. In an embodiment of the present disclosure, the first signal terminal 221' and the second signal terminal 222' form a pair of differential signal terminals. In the illustrated embodiment of the present disclosure, the first signal terminal 221' and the second signal terminal 222' are symmetrically arranged along a central axis of the insulating block 223'.

When assembling, firstly, the plurality of shielding shells 23' are sleeved on the insulating protrusions 214' along a top-to-bottom direction, so that the hollow portions 231' enclose the insulating protrusions 214'. The U-shaped mounting portions 232' are inserted into the U-shaped positioning grooves 2104'. The first tail portions 2324' and the second tail portions 2325' respectively extend beyond the bottom surface 2102' and are exposed in the receiving groove 2100'. The mounting portions 232' are partially exposed in the receiving groove 2100' to increase the shielding length of the first signal terminal 221' and the second signal terminal 222'. When the shielding shells 23' are installed in place, the first barbs 2321a' and the second barbs 2322a' will pierce the inner wall of the positioning grooves 2104' so as to improve the fixing force.

Secondly, the second terminal modules 22' are inserted into the corresponding positioning grooves 2104' along a bottom-to-top direction. When the second terminal modules 22' are installed in place, top surfaces of the insulating blocks 223' press against bottom surfaces of partitions 2145' so as to achieve position restriction.

Thirdly, the retaining portions 2326' are bent inwardly so that the retaining portions 2326' abut against the corresponding insulating blocks 223'. With this arrangement, on the one hand, the shielding shells 23' can be prevented from escaping upwardly from the insulating protrusions 214', and on the other hand, the second terminal modules 22' can be prevented from being separated from the housing 21'.

Finally, the second mounting block 24' is installed in the receiving groove 2100' along the bottom-to-top direction. The first tail portions 2324' and the second tail portions 2325' of the shielding shell 23' extend through mounting holes 243' of the second mounting block 24' so as to be electrically connected to the second circuit board 302.

When the first backplane connector 100 is mated with the second backplane connector 200', the first housing 1 of the first backplane connector 100 is inserted into the receiving space 213' of the housing 21' of the second backplane connector 200'. The hollow portions 231' of the second terminal modules 22' of the second backplane connector 200' are inserted into the first terminal modules 2 of the first backplane connector 100 under the guidance of the deflection portions 2315'.

The above embodiments are only used to illustrate the present disclosure and not to limit the technical solutions described in the present disclosure. The understanding of this specification should be based on those skilled in the art. Descriptions of directions, although they have been described in detail in the above-mentioned embodiments of the present disclosure, those skilled in the art should understand that modifications or equivalent substitutions can still be made to the application, and all technical solutions and improvements that do not depart from the spirit and scope of the application should be covered by the claims of the application.

What is claimed is:

1. A shielding shell for at least partially surrounding signal terminals, the shielding shell comprising:
   a first side wall;
   a second side wall; and
   a third side wall, the second side wall connecting the first side wall and the third side wall, and the first side wall and the third side wall are disposed face to face;
   wherein an end of at least one of the first side wall, the second side wall and the third side wall comprises a deflection portion which is bent inwardly, and the deflection portion is adapted to guide insertion of the shielding shell into a mating connector;
   wherein the shielding shell further comprises a fourth side wall, the fourth side wall and the second side wall are disposed face to face;
   wherein the first side wall, the second side wall, the third side wall and the fourth side wall jointly form a hollow portion.

2. The shielding shell according to claim 1, wherein each end of the first side wall, the second side wall, the third side wall and the fourth side wall comprises the deflection portion; and wherein the deflection portions are separated from each other.

3. A shielding shell for at least partially surrounding signal terminals, the shielding shell comprising:
- a first side wall;
- a second side wall; and
- a third side wall, the second side wall connecting the first side wall and the third side wall, and the first side wall and the third side wall are disposed face to face;
- wherein an end of at least one of the first side wall, the second side wall and the third side wall comprises a deflection portion which is bent inwardly, and the deflection portion is adapted to guide insertion of the shielding shell into a mating connector;
- wherein the shielding shell further comprises a first extension piece protruding beyond the first side wall, a pair of first slots located on both sides of the first extension piece, a second extension piece protruding beyond the third side wall, and a pair of second slots located on both sides of the second extension piece;
- wherein the first extension piece and the second extension piece are adapted for contacting ground terminals; and
- wherein the first slots and the second slots are adapted to fix metal shields, and make the shielding shell be in contact with the metal shields.

4. The shielding shell according to claim 2, further comprising a mounting portion extending from the hollow portion, the mounting portion comprising a base portion, a first bending portion bent from one side of the base portion, and a second bending portion bent from the other side of the base portion;
- wherein the base portion is connected to the third side wall, the first bending portion and the second side wall are located on a same side, and the second bending portion and the fourth side wall are located on a same side.

5. The shielding shell according to claim 4, wherein the base portion is coplanar with the third side wall, the first bending portion protrudes outwardly beyond the second side wall, and the second bending portion protrudes outwardly beyond the fourth side wall.

6. The shielding shell according to claim 5, wherein the first bending portion comprises a plurality of first barbs on a side away from the third side wall, the second bending portion comprises a plurality of second barbs on a side away from the third side wall, and the first barbs and the second barbs are adapted for being fixed in a housing.

7. The shielding shell according to claim 2, wherein the mounting portion comprises a retaining portion bent from a bottom of the base portion in a direction toward the first side wall.

8. The shielding shell according to claim 4, further comprising a first tail portion extending from the first bending portion and a second tail portion extending from the second bending portion; wherein the first tail portion and the second tail portion are adapted for being mounted on a circuit board.

9. The shielding shell according to claim 1, wherein the shielding shell is formed by stamping, bending and riveting a metal plate, and the first side wall comprises a first wall portion and a second wall portion; and wherein the first wall portion and the second wall portion are fixed together by riveting, and a riveting line is formed at a junction of the first wall portion and the second wall portion.

10. A shielding shell for at least partially surrounding signal terminals, the shielding shell comprising:
- a first side wall located in a first plane;
- a second side wall located in a second plane;
- a third side wall located in a third plane; and
- a fourth side wall located in a fourth plane;
- wherein the first plane is parallel the third plane, and the second plane is parallel to the fourth plane;
- the first side wall, the second side wall, the third side wall and the fourth side wall are connected in sequence in a circumferential direction so as to form a hollow portion; the hollow portion defines a receiving cavity in which the signal terminals at least partially reside;
- the shielding shell further comprises at least one deflection portion which is bent inwardly from an end of at least one of the first side wall, the second side wall, the third side wall and the fourth side wall; the at least one deflection portion is configured to guide insertion of the shielding shell into a mating connector.

11. The shielding shell according to claim 10, wherein the at least one deflection portion comprises a first deflection portion bent inwardly from the first side wall, a second deflection portion bent inwardly from the second side wall, a third deflection portion bent inwardly from the third side wall and a fourth deflection portion bent inwardly from the fourth side wall.

12. The shielding shell according to claim 11, wherein the first deflection portion, the second deflection portion, the third deflection portion and the fourth deflection portion are separated from one another along the circumferential direction.

13. The shielding shell according to claim 11, wherein the first deflection portion deviates from the first plane, the second deflection portion deviates from the second plane, the third deflection portion deviates from the third plane, and the fourth deflection portion deviates from the fourth plane.

14. The shielding shell according to claim 10, further comprising a mounting portion extending from the hollow portion, the mounting portion comprising a base portion, a first outer wall connected to one side of the base portion, and a second outer wall connected to the other side of the base portion;
- wherein the base portion is connected to the third side wall, the first outer wall and the second side wall are located on a same side, and the second outer wall and the fourth side wall are located on a same side.

15. The shielding shell according to claim 14, wherein the base portion is coplanar with the third side wall, the first outer wall protrudes outwardly beyond the second side wall, and the second outer wall protrudes outwardly beyond the fourth side wall.

16. The shielding shell according to claim 15, wherein the first outer wall is separated from the second side wall; and the second outer wall is separated from the fourth side wall.

17. The shielding shell according to claim 10, wherein the at least one deflection portion is arc-shaped.

18. The shielding shell according to claim 10, wherein the shielding shell is formed by stamping, bending and riveting a metal plate, and the first side wall comprises a first wall portion and a second wall portion; and wherein the first wall portion and the second wall portion are fixed together by riveting, and a riveting line is formed at a junction of the first wall portion and the second wall portion.

19. The shielding shell according to claim 14, further comprising at least one mounting foot extending from the mounting portion and configured to be electrically connected to a circuit board.

* * * * *